United States Patent [19]

Arimatsu et al.

[11] Patent Number: 5,378,579
[45] Date of Patent: Jan. 3, 1995

[54] PHOTOPOLYMERIZABLE COMPOSITION AND PHOTOSENSITIVE LITHOGRAPHIC PRINTING PLATE

[75] Inventors: Seiji Arimatsu, Osaka; Takakazu Hase, Hyogo; Yoshifumi Ichinose, Osaka, all of Japan

[73] Assignee: Nippon Paint Co., Ltd., Osaka, Japan

[21] Appl. No.: 910,501

[22] Filed: Jul. 8, 1992

[30] Foreign Application Priority Data

Jul. 11, 1991 [JP] Japan .................................. 3-171068

[51] Int. Cl.$^6$ ............................................. G03C 1/725
[52] U.S. Cl. ...................................... 430/281; 430/916; 430/919; 522/14; 522/18; 522/25; 522/26; 522/28
[58] Field of Search ........................ 430/281, 916, 919; 522/14, 18, 25, 26, 28

[56] References Cited

U.S. PATENT DOCUMENTS

| | | | |
|---|---|---|---|
| 4,278,751 | 7/1981 | Specht et al. | 430/281 |
| 4,868,092 | 9/1989 | Kawahata et al. | 430/281 |

FOREIGN PATENT DOCUMENTS

| | | |
|---|---|---|
| 0276016 | 7/1988 | European Pat. Off. . |
| 0386780 | 9/1990 | European Pat. Off. . |

*Primary Examiner*—Marion E. McCamish
*Assistant Examiner*—Mark A. Chapman
*Attorney, Agent, or Firm*—Wenderoth, Lind & Ponack

[57] ABSTRACT

A photopolymerizable composition comprising
(A) an addition-polymerizable compound having an ethylenically unsaturated double bond,
(B) a compound of the formula:

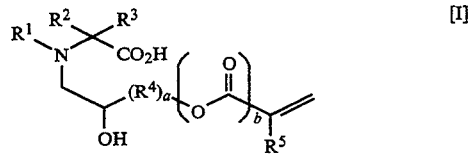

[wherein $R^1$ is a substituted or nonsubstituted phenyl group, $R^2$ and $R^3$ are the same or different and indicate a hydrogen atom or a $C_{1-4}$ alkyl group, $R^4$ in an alkylene group which may have at least one substituent selected from alkyl, hydroxyl and oxo (=O) on a main chain, or which may contain at least one member selected from an oxygen atom and a cycloalkylene group in a main chain, $R^5$ is a hydrogen atom or a methyl group, and a and b are independently 0 or 1],
(C) a light absorbing compound, and
(D) a film-forming polymer having alkaline solubility or alkaline swelling characteristic is disclosed. There is also disclosed a photosensitive lithographic printing plate comprising the photopolymerizable composition.

7 Claims, 1 Drawing Sheet

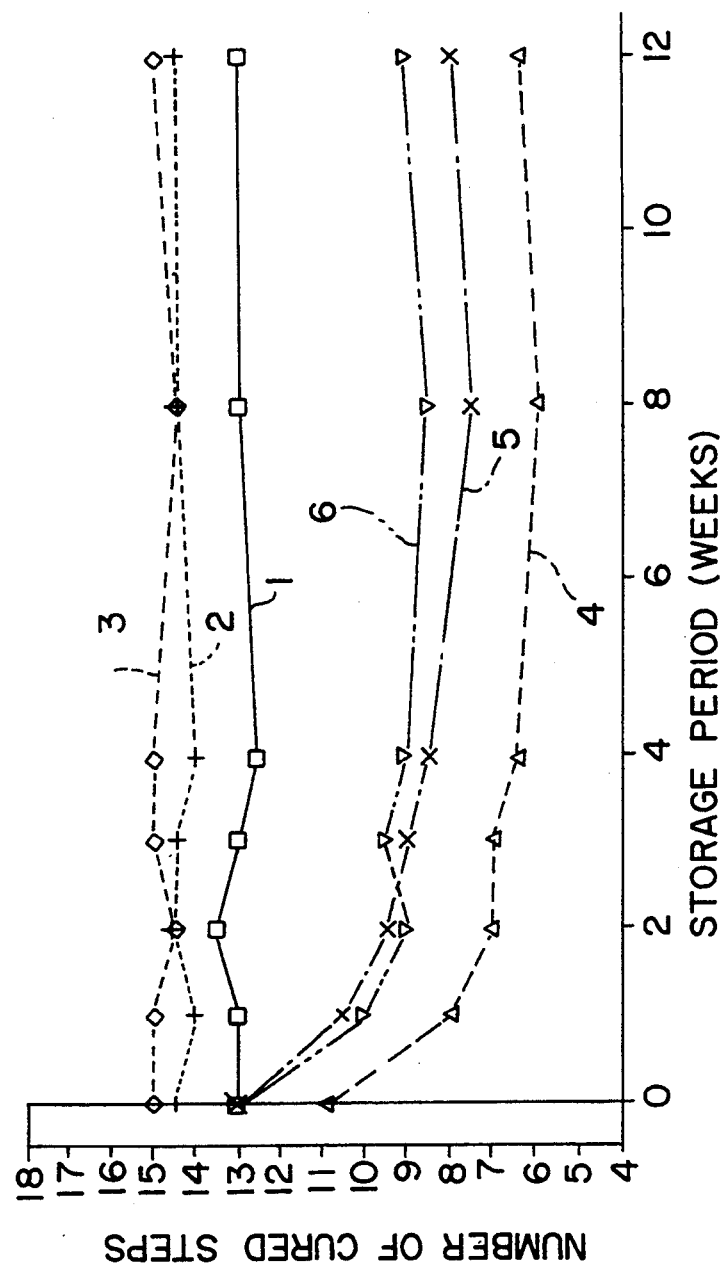

PHOTOPOLYMERIZABLE COMPOSITION AND PHOTOSENSITIVE LITHOGRAPHIC PRINTING PLATE

FIELD OF THE INVENTION

The present invention relates to a photopolymerizable composition and a photosensitive lithographic printing plate. More particularly, it relates to a photopolymerizable composition having high sensitivity to a light source between ultraviolet range and visible range as well as excellent storage stability, which is used for a photosensitive lithographic printing plate or a photosensitive resist, and a photosensitive lithographic printing plate produced therefrom.

BACKGROUND OF THE INVENTION

Photopolymerizable compositions have been widely used in the fields of printing and electronic material as photosensitive lithographic printing plates, photosensitive materials (e.g. photoresist, hologram, etc.) and the like, because a tough film is obtained by enhancing the photocrosslinking degree and photosensitivity can be easily improved by correct selection of a photopolymerization initiating system. Recently, as computer and laser technologies are remarkably advanced, it is requested that an image information subjected to computer processing can be directly recorded on a photopolymerizable composition layer by a laser scanning exposure.

These photopolymerizable compositions generally contain a polymerizable compound (e.g. a compound having an ethylenically unsaturated double bond, etc.), a polymerization initiating system (e.g. photopolymerization initiator, sensitizer, etc.) and, optionally, an organic polymer compound having solubility or swelling characteristic to solvent, alkaline solution or water. For the photopolymerizable composition which is directly used for recording the image information by laser, it is requested to have a photosensitive wave length range even within visible light wave length range, high sensitivity and excellent stability, as significant properties.

In order to meet the requirement, various photopolymerizable compositions having the photosensitive wave length range within the visible light range are suggested. Most of them are combinations of radical polymerization initiators with light absorbing compounds and, for example, combinations of N-aryl-α-amino acids such as N-phenylglycine with light absorbing dyes such as coumarin dyes (Japanese Patent Kokai No. 63-180946), thioxanthene dyes (Japanese Patent Kokai Nos. 63-043133 and 1-126302) or cyanine dyes (Japanese Patent Kokai No. 1-287105)); a combination of N-aryl-α-amino acids with aminobenzylidenecarbonyl compounds (Japanese Patent Kokai No. 1-131205); a combination of triazine compounds with cyanine dyes (Japanese Patent Kokai No. 2-189548); combinations of hexaarylbisimidazoles and thiols with dyes (Japanese Patent Kokai No. 1-279903); a combination of iron-allene complex with p-aminophenyl unsaturated ketones (Japanese Patent Kokai No. 2-305806) and the like are reported.

All of the above photopolymerizable compositions have the photosensitive wave length range in visible range but photosensitivity is not sufficient. For example, when image recording is conducted at high speed by a low output air-cooled argon laser, the photosensitivity is too low to proceed and it is thus necessary to make the composition more highly photosensitive. However, when photosensitivity is made higher, storage stability is lowered because the deterioration of sensitivity or insolubilization due to dark reaction arises and, therefore, they were of no practical use.

OBJECTS OF THE INVENTION

One object of the present invention is to provide a photopolymerizable composition having high sensitivity to visible light range and excellent storage stability, in which image recording can be conducted at sufficiently practical speed even if using a low output laser.

Another object of the present invention is to provide a photosensitive lithographic printing plate obtained from the photopolymerizable composition.

These objects as well as other objects and advantages of the present invention will become apparent to those skilled in the art from the following description.

BRIEF EXPLANATION OF DRAWINGS

FIG. 1 is a graph illustrating sensitivity changes of each photopolymerizable composition on storage at 40° C. wherein 1 is a photopolymerizable composition of Example 4, 2 is a photopolymerizable composition of Example 5, 3 is a photopolymerizable composition of Example 6, 4 is a photopolymerizable composition of Comparative Example 4, 5 is a photopolymerizable composition of Comparative Example 5 and 6 is a photopolymerizable composition of Comparative Example 6.

SUMMARY OF THE INVENTION

The present inventors have found that the above objects can be accomplished by using a suitable compound as a radical polymerization initiator, and the present invention has been completed.

That is, according to the present invention, there is provided a photopolymerizable composition comprising (A) an addition-polymerizable compound having an ethylenically unsaturated double bond, (B) a compound of the formula:

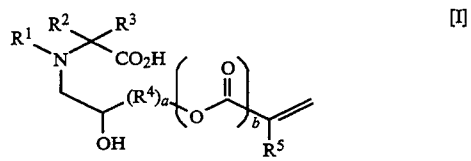

[wherein $R^1$ is a substituted or nonsubstituted phenyl group, $R^2$ and $R^3$ are the same or different and indicate a hydrogen atom or a $C_{1-4}$ alkyl group, $R^4$ is an alkylene group which may have at least one substituent selected from alkyl, hydroxyl and oxo (=O) on a main chain, or which may contain at least one member selected from an oxygen atom and a cycloalkylene group in a main chain, $R^5$ is a hydrogen atom or a methyl group, and a and b are independently 0 or 1], (C) a light absorbing compound, and (D) a film-forming polymer having alkaline solubility or alkaline swelling characteristic.

The present invention also provides a photosensitive lithographic printing plate of which the photosensitive layer comprises the photopolymerizable composition mentioned above.

DETAILED DESCRIPTION OF THE INVENTION

The addition-polymerizable compound having an ethylenically unsaturated double bond (hereinafter, sometimes, referred to as "ethylenic compound") to be formulated in the photopolymerizable composition of the present invention is one that is addition-polymerized by the action of the photopolymerization initiator to substantially insolubilize the cured article to a developer. As the ethylenic compound, for example, there are unsaturated carboxylic acids such as acrylic acid, methacrylic acid, itaconic acid, maleic acid and the like; esters of polyhydroxy compounds such as ethylene glycol, tetraethylene glycol, neopentyl glycol, propylene glycol, 1,2-butanediol, trimethylolpropane, pentaerythritol and dipentaerythritol and the like with the above unsaturated carboxylic acids; reactants of trimethylolpropane polyglycidyl ether, pentaerythritol polyglycidyl ether, propylene glycol diglycidyl ether or epichlorohydrin with 2,2-bis(4-hydroxyphenyl)-propane; adducts of epoxides such as diglycidyl ester of phthalic acid and the like with the above unsaturated carboxylic acids; (meth)acrylamides such as (meth)acrylamide, ethylene bis(meth)acrylamide, hexamethylene bis(meth)acrylamide and the like, and at least one sort of them may be used. Among them, (meth)acrylic esters are preferred.

The compound of the formula [I] to be formulated in the photopolymerizable composition of the present invention can be a radical polymerization initiator and at least one such compound may be used. The compound [I] can be obtained, for example, by subjecting N-aryl-α-amino acids of the formula:

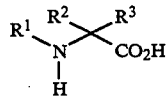

[II]

[wherein $R^1$ to $R^3$ are defined above] and a compound having an epoxy group and (meth) acryloyl or a vinyl group optionally substituted with methyl group (hereinafter, sometimes, referred to as "compound [III]") to an addition reaction.

Examples of N-aryl-α-amino acids [II] include N-phenylglycine, N-phenylalanine, N-phenylvaline, N-phenylleucine, N-(p-tolyl)-glycine, N-(p-chlorophenyl)glycine, N-(p-bromophenyl)glycine, N-(p-iodophenyl)glycine and the like. Among them, N-phenylglycine, N-(p-chlorophenyl)glycine, N-(p-bromophenyl)glycine and N-(p-iodophenyl)glycine are particularly preferred.

As the compound [III], for example, there is a compound having an epoxy group at one molecular terminal end and a (meth)acryloyl or (methyl)vinyl group at the other molecular terminal end. Preferably, it has a (meth)acryloyl at the other molecular terminal end. The compound [III] can be obtained by a known synthesis method or obtained as a commercially available product. For example, the compound [III] may be a compound (i) obtained by opening one terminal epoxy resin group of a compound, wherein both terminal hydroxyl groups of polyols (preferably $C_{2-18}$ polyol such as polyethylene glycol, polypropylene glycol, neopentyl glycol, 1,6-hexanediol, glycerin, hydrogenated bisphenol A, etc.) are modified with epichlorohydrin, with (meth)acrylic acid; a compound (ii) obtained by reacting hydroxyalkyl (meth)acrylates [preferably hydroxyalkyl (meth)acrylate of which alkyl has 2 to 8 carbon atoms, such as hydroxyethyl (meth)acrylate, hydroxypropyl (meth)acrylate, etc.], polyethylene glycol mono(meth)acrylate or polypropylene glycol (meth)acrylate with epichlorohydrin; or a compound (iii) obtained by modifying the above-described hydroxyalkyl (meth)acrylates with lactones (e.g. ε-caprolactone, γ-butyrolactone, α-methyl-γ-butyrolactone, etc.), followed by additional reaction with epichlorohydrin. Examples of the above compound (i) include the following:

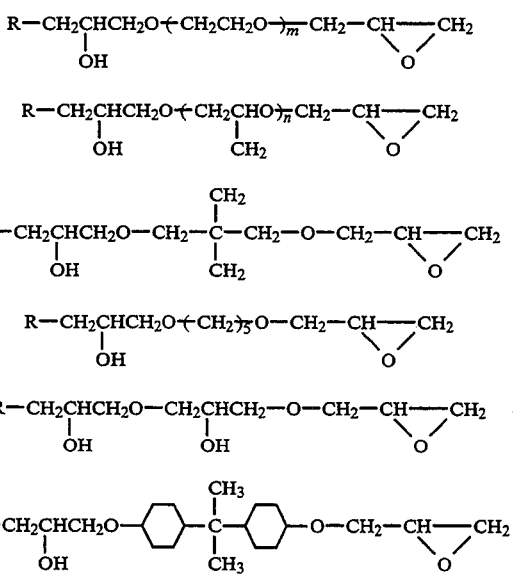

[wherein, R is

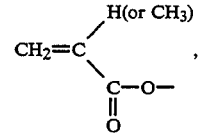

m is 1, 4 or 9 and n is 1 or 3].

Examples of the compound (ii) include the following:

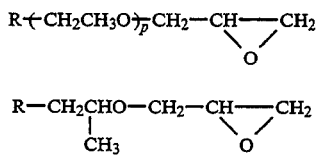

[wherein p is 1, 2 or 5 and R is as defined above].

Examples of the compound (iii) include the following:

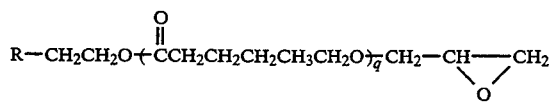

[wherein q is an integer of 1 to 5 and R is as defined above].

Further, the compound [III] may also be a compound which preferably has an epoxy group and a (methyl)vinyl group at both terminal ends, respectively. Examples thereof include compounds having a (methyl)vinyl group in place of a (meth)acryloyl group (i.e. R group) in the above compounds (i) to (iii). These compounds are synthesized by a known method. Further, as the compound [III], a commercially available product may be used. Examples of the commercially available compound [III] include compounds of the following formulas:

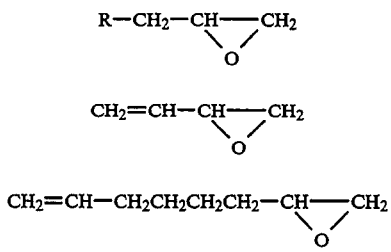

[wherein, R is as defined above].

The synthesis reaction of the compound [I] according to the addition of the above compound [III] to N-aryl-α-amino acids [II] may be easily conducted by a normal method because the compound [III] contains an epoxy group having high reactivity in its molecule. The reaction ratio may be substantially a stoichiometric ratio, but number of equivalents of the compound [III] may be practically 0.9 to 1.2 based on 1 equivalent of the amino acids [II]. Upon the addition reaction, it is preferred to add a thermal polymerization inhibitor. The addition reaction is normally conducted under the presence of a solvent (e.g. water, methanol etc.). The reaction condition is suitably selected, for example, the reaction may be conducted at 20° to 80° C. for 1 to 10 hours. In the addition reaction, a suitable synthesis method is selected depending on the kind of compounds. For example, when glycidyl methacrylate is added to N-phenylglycine, sodium salt or potassium salt of N-phenylglycine is dissolved in a suitable solvent, to which is added dropwise glycidyl methacrylate at a suitable temperature with stirring under the presence of a polymerization inhibitor to complete the addition reaction, and then the reaction mixture is acidified to easily form a crystal.

The light absorbing compound to be formulated in the photopolymerizable composition of the present invention has a function as a sensitizer for the above compound [I]. By formulating the light absorbing compound, the resulting composition can also have high sensitivity to visible light. As the light absorbing compound, for example, there are common dyes such as rose bengal, eosin and the like; coumarin dyes such as 3,3'-carbonylbiscoumarin and the like as described in Japanese Patent Kokai No. 63-180946; xanthene or thioxanthene dyes as described in Japanese Patent Kokai Nos. 63-043133 and 1-126302; cyanine dyes as described in Japanese Patent Kokai No. 1-287105; merocyanine dyes as described in Japanese Patent Kokai No. 63-278909; titanocene and derivatives thereof as described in Japanese Patent Kokai Nos. 2-000249 and 2-000291 and the like. At least one of them may be used.

In order to further enhance the sensitizing speed, it is preferred, if necessary, to further add diaryliodonium salts such as chloride, bromide, tetrafluoroborate, hexafluorophosphate, hexafluoroarsenate, hexafluoroantimonate of iodonium [e.g. diphenyliodonium, bis(p-chlorophenyl)iodonium, ditolyliodonium, bis(p-t-butylphenyl)iodonium, bis(m-nitrophenyl)iodonium, etc.].

The film-forming polymer having solubility or swelling characteristic to alkaline solution (hereinafter, sometimes referred to as "film-forming polymer") to be formulated in the photopolymerizable composition of the present invention can be a so-called binder resin. Such film-forming polymer has solubility or swelling characteristic to alkaline solution such that a developer such as alkaline solution which is preferred for reasons of safety and sanitation can be used in the developing step after light irradiation. Examples of the film-forming polymer include copolymers of α, β-unsaturated carboxylic acids [e.g. (meth)acrylic acid, itaconic acid, crotonic acid, partially alkylesterified maleic acid, etc.] with alkyl (meth)acrylates, (meth)acrylonitrile and the like; copolymers of vinyl carboxylates (e.g. vinyl acetate, etc.) with alkyl (meth)acrylates; copolymers of anhydrous carboxylic acids (e.g. anhydrous maleic acid, etc.) with optionally substituted styrenes, unsaturated hydrocarbons (e.g. ethylene, propylene, butadiene, isoprene, etc.), unsaturated ethers (e.g. vinyl methyl ether, vinyl ethyl ether, vinyl isobutyl ether, etc.) or esters [e.g. methyl (meth)acrylate, ethyl (meth)acrylate, etc.] and esterified products thereof; esterified products of copolymer having hydroxyl group [e.g. several kinds of alkyl (meth)acrylate copolymer containing hydroxyethyl methacrylate as one component, polyvinyl phenol derivative, etc.] with dicarboxylic acids or polycarboxylic acids or anhydrides thereof (e.g. anhydrous maleic acid, anhydrous phthalic acid, citric acid, etc.); copolymers of hydroxyalkyl (meth)acrylates with alkyl (meth)acrylates, (meth)acrylonitrile and the like; copolymers of allyl alcohols with optionally substituted styrenes; copolymers of vinyl alcohol with alkyl (meth)acrylates or other copolymerizable unsaturated compounds; acidic cellulose modified products having carboxyl groups at the side chain; polyurethanes having free OH group; epoxy resins; polyesters; partially saponified vinyl acetate copolymers; polyvinyl acetals having free OH group; copolymers of hydroxystyrene with alkyl (meth)acrylates and the like; phenol/formaldehide resins; polyethers or polyamides of polyethylene oxide, polyvinyl-pyrrolidone or epichlorohydrin with 2,2-bis-(4-hydroxyphenyl)propane and the like. At least one of them may be used. Further, these film-forming forming polymers may have a functional group which is crosslinkable itself, for example, (meth)acryloyl group, cinnamoyl group and the like at the side chain.

Further, additives such as thermal polymerization inhibitors, plasticizers, colorants, surfactants, coupling agents and the like may also be added to the photopolymerizable composition of the present invention.

In the photopolymerizable composition of the present invention, the preferred amount of the ethylenic compound, the compound [I], the light absorbing compound and the film-formable polymer are 15 to 80% by weight (particularly 25 to 70% by weight), 1 to 20% by weight (particularly 4 to 15% by weight), 1 to 20% by weight (particularly 4 to 15% by weight), and 15 to 80% by weight (particularly 25 to 70% by weight) based on the total weight of the solid content in the composition, respectively.

The photopolymerizable composition of the present invention may be prepared by a normal method. For example, the photopolymerizable composition can be prepared by formulating the above essential components and additive components as they are, or optionally formulating the components together with a solvent [e.g. ketone solvents such as methyl ethyl ketone, acetone, cyclohexanone, etc.; ester solvents such as ethyl acetate, butyl acetate, ethylene glycol diacetate, etc.; aromatic solvents such as toluene, xylene, etc.; cellosolve solvents such as methyl cellosolve, ethyl cellosolve, butyl cellosolve, etc.; alcohol solvents such as methanol, ethanol, propanol, etc.; ether solvents such as tetrahydrofuran, dioxane, etc.; halogen solvents such as dichloromethane, chloroform, etc.; halogen solvents such as dichloromethane, chloroform, etc.]and mixing them in a dark place, for example, with a high speed mixer.

By using the photopolymerizable composition of the present invention thus prepared as described above, a photosensitive lithographic printing plate of the present invention can be produced. That is, the photosensitive lithographic printing plate of the present invention can be produced by applying the above photopolymerizable composition of the present invention on a substrate, for example, with a bar coater or spinner and drying to form a photosensitive layer, according to a normal method. Further, a known technique for protecting the surface and preventing bad influences such as deterioration of sensitivity due to oxygen may be applied to the photosensitive layer formed. For example, a peelable transparent cover sheet or a coating layer made of wax-like substance having low oxygen permeability, water-soluble or alkaline soluble polymer, etc. can be provided on the photosensitive layer. As the substrate, for example, there are papers, plastics, metals and the like, and metals are preferred. Examples of the metal include aluminum, magnesium, zinc, chromium, iron, nickel and alloy of these metals.

The substrate surface may be flat or roughened. As the method for roughening the surface of the metal substrate, there can be used various methods and examples thereof include mechanical methods such as ball grinding method, blush grinding method, etc.; chemical methods such as a method for etching with a solution containing acid, etc.; electrochemical methods such as a method for etching by electrolysis, etc.

As the preferred substrate in the present invention, there can be used aluminum. Among them, aluminum of which the surface is roughened is preferred. Particularly, that of which the roughened surface is further subjected to anodizing treatment and chemical conversion treatment (e.g. silicate treatment, etc.) is preferred.

Then, the photosensitive layer is irradiated through a negative film or imagewise light scanning. As the light source used for light irradiation, there can be used conventional light sources generating visible ray or ultraviolet ray, for example, lasers such as semiconductor laser, helium-neon laser, argon laser, helium-cadmium laser and kripton laser, light emitting diode, ultrahigh pressure mercury lamp, high pressure mercury lamp, medium pressure mercury lamp, metal halide lamp, tungsten lamp and the like. By developing after light irradiation, the photosensitive layer of the non-exposed part is removed to obtain a lithographic printing plate. As the developing solution, a suitable solution which dissolved the photosensitive layer of the non-exposed part, for example, a commercially available developing solution for offset lithographic printing plate may be used, in addition to alkaline solution such as sodium metasilicate solution, sodium bicarbonate solution, triethanolamine solution, ammonium water and the like.

The reason that the photopolymerizable composition of the present invention has high sensitivity and excellent storage stability is not clear but is surmised as follows. That is, the compound [I] is that in which an unsaturated double bond is added to N-aryl-α-amino acids [II] and, therefore, a radical generated by light irradiation effectively contributes to the polymerization reaction in comparison with the other case (i.e. N-aryl-α-amino acids [II] itself). Further, since such reactive group is added to N atom, the compound [I] is highly stabilized in comparison with N-aryl-α-amino acids [II].

As described above, the photopolymerizable composition of the present invention has sufficiently high sensitivity even at visible light range and is superior in long term-storage stability. Accordingly, the photosensitive lithographic printing plate produced by using the above photopolymerizable composition of the present invention can produce an economically advantageous and practical image forming material by which image recording can be conducted at sufficiently high speed even if a low output energy laser such as air-cooled argon laser is used.

The following Synthesis Examples, Examples and Comparative Examples further illustrate the present invention in detail but are not to be construed to limit the scope thereof. Hereinafter, all "parts" are parts by weight unless otherwise stated.

SYNTHESIS EXAMPLE 1

Synthesis of compound [I]

To a solution of N-phenylglycine (18.0 g, 0.12 moles) in methanol (160 g) was slowly added an aqueous sodium hydroxide solution (water:180 g, sodium hydroxide:4.8 g). After stirring for 10 minutes, 4-methoxyphenol (120 mg) and glycidyl methacrylate (23.7 g, 0.167 moles) were added to the mixture which was heated to 50° C. and stirred for additional 3 hours. Methanol was distilled off from the reaction mixture, which was poured into methylene chloride and extracted twice with water. The precipitate deposited by acidifying a total system with an aqueous hydrochloric acid solution was filtered and dried to obtain a white crystal. $^1$H-NMR and IR spectrum measurement showed that the objective compound of the formula:

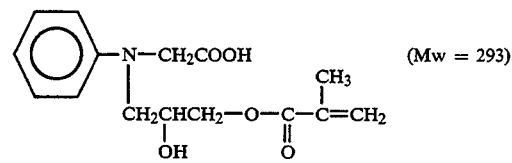

was obtained,

SYNTHESIS EXAMPLE 2

According to the same manner as that described in Synthesis Example 1 except for using the above compound (i) (provided that m is 1) in place of glycidyl methacrylate, a compound of the formula:

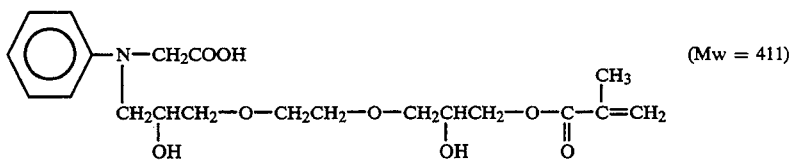

(Mw = 411)

was obtained.

SYNTHESIS EXAMPLE 3

According to the same manner as that described in Synthesis Example 1 except for using the above compound (ii) (provided that p is 1) in place of glycidyl methacrylate, a compound of the formula:

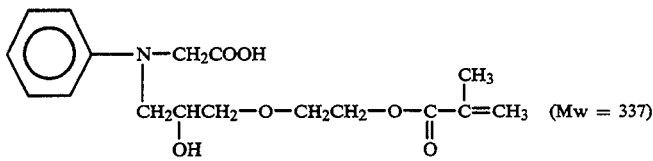

(Mw = 337)

was obtained.

EXAMPLES 1 to 18 AND COMPARATIVE EXAMPLES 1 to 6

Preparation of photopolymerizable compound and production of photosensitive lithographic printing plate By using each compound obtained in Synthesis Examples 1 to 3 as a radical polymerization initiator and using dye A, B or C as a light absorbing compound, a photopolymerizable composition of a formulation shown in Tables 1 and 2 was prepared, respectively (Examples 1 to 18). According to the same manner as that described in Examples 1 to 18 except for using N-phenylglycine (NPG) in place of the compound obtained in Synthesis Examples 1 to 3, a photopolymerizable composition was prepared (Comparative Examples 1 to 6).

TABLE 1

| Components | Amount (parts) |
| --- | --- |
| Acrylic resin (Mw = 2 × $10^5$, AV = 19)[1] | 31.94 |
| St-MA halfester (Mw = 2 × $10^4$, AV = 185)[2] | 17.85 |
| Urethane oligomer[3] | 31.94 |
| Pentaerythritol triacrylate | 56.37 |
| Thermal polymerization inhibitor[4] | 1.88 |
| Compound of Synthesis Example 1, 2 or 3 | x |
| Light absorbing dye A, B or C[5] | y |
| Sensitizer D[6] | z |
| Colorant (Victoria pure blue) | 1.41 |
| Methyl cellosolve | 300.00 |
| Ethanol | 300.00 |
| Methyl ethyl ketone | 798.60 |
| Total | 1540.00 + x + y + z |

(Note)
[1] B723 (trade name), manufactured by Polyvinyl Chemical Co.
[2] Scripset 540 (trade name), manufactured by Monsanto Co.
[3] Viscoat 813 (trade name), manufactured by Osaka Yuki Kagaku Kogyo K.K.
[4] 2,6-di-t-butyl-4-methyl-phenol
[5] Dye A Dye B Dye C

[6] Sensitizer D

TABLE 2

| | | Sensitivity of photopolymerizable composition | | | | | |
| --- | --- | --- | --- | --- | --- | --- | --- |
| | Initiator | Amount of x[1] (parts) | Dye | Amount of y (parts) | Sensitizer | Amount of z (Parts) | Number of cured steps[2] | Laser image[3] |
| Ex. 1 | Syn. Ex. 1 | 11.6 | A | 6 | — | — | 12 | B |
| Ex. 2 | Syn. Ex. 1 | 11.6 | B | 6 | — | — | 13.5 | A |
| Ex. 3 | Syn. Ex. 1 | 11.6 | C | 6 | — | — | 14.5 | A |
| Ex. 4 | Syn. Ex. 1 | 11.6 | A | 6 | D | 1 | 13 | A |
| Ex. 5 | Syn. Ex. 1 | 11.6 | B | 6 | D | 1 | 14.5 | A |
| Ex. 6 | Syn. Ex. 1 | 11.6 | C | 6 | D | 1 | 15 | A |
| Ex. 7 | Syn. Ex. 2 | 16.3 | A | 6 | — | — | 11 | B |
| Ex. 8 | Syn. Ex. 2 | 16.3 | B | 6 | — | — | 13 | A |

TABLE 2-continued

Sensitivity of photopolymerizable composition

| | Initiator | Amount of x[1] (parts) | Dye | Amount of y (parts) | Sensitizer | Amount of z (Parts) | Number of cured steps[2] | Laser image[3] |
|---|---|---|---|---|---|---|---|---|
| Ex. 9 | Syn. Ex. 2 | 16.3 | C | 6 | — | — | 13.5 | A |
| Ex. 10 | Syn. Ex. 2 | 16.3 | A | 6 | D | 1 | 12 | B |
| Ex. 11 | Syn. Ex. 2 | 16.3 | B | 6 | D | 1 | 13.5 | A |
| Ex. 12 | Syn. Ex. 2 | 16.3 | C | 6 | D | 1 | 14.5 | A |
| Ex. 13 | Syn. Ex. 3 | 13.4 | A | 6 | — | — | 11.5 | B |
| Ex. 14 | Syn. Ex. 3 | 13.4 | B | 6 | — | — | 13.5 | A |
| Ex. 15 | Syn. Ex. 3 | 13.4 | C | 6 | — | — | 14.5 | A |
| Ex. 16 | Syn. Ex. 3 | 13.4 | A | 6 | D | 1 | 12.5 | B |
| Ex. 17 | Syn. Ex. 3 | 13.4 | B | 6 | D | 1 | 14.5 | A |
| Ex. 18 | Syn. Ex. 3 | 13.4 | C | 6 | D | 1 | 15 | A |
| Comp. Ex. 1 | NPG | 6 | A | 6 | — | — | 10 | C |
| Comp. Ex. 2 | NPG | 6 | B | 6 | — | — | 12 | B |
| Comp. Ex. 3 | NPG | 6 | C | 6 | — | — | 12.5 | B |
| Comp. Ex. 4 | NPG | 6 | A | 6 | D | 1 | 11 | B |
| Comp. Ex. 5 | NPG | 6 | B | 6 | D | 1 | 13 | A |
| Comp. Ex. 6 | NPG | 6 | C | 6 | D | 1 | 13 | A |

[1] All of compounds of Synthesis Examples 1 to 3 were prepared in the same molar amount.
[2] The larger the number of cured steps, the higher the sensitivity.
[3] The image evaluation by a laser was conducted according to the following criteria. A: clear   B: slightly clear   C: not clear Then, each photopolymerizable composition described above was applied on an aluminum substrate, which had been roughened by a blush grinding and electropolishing and subjected to anodizing treatment as well as hydrophilization treatment (with sodium silicate), using a bar coater so that the coating weight becomes 2 g/m² on drying, and dried in a drying oven maintained at 60° C. for 4 minutes. Further, an aqueous 5% polyvinyl alcohol (saponification degree: 88 molar %, polymerization degree: 500) was applied on the photosensitive layer using a bar coater so that the coating weight becomes 2 g/m² on drying, and dried in a drying oven maintained at 60° C. for 5 minutes to form an overcoat layer.

Then, each photosensitive lithographic printing plate thus obtained was placed with Step Tablet No. 2 (21 steps) manufactured by Kodak Co. and irradiated for 3 seconds with the light (light intensity: 3.3 mW/cm²) having a wave length of 490 nm which was taken out from a Xenone lamp (150 W) manufactured by Ushio Denki K. K. through TOSHIBA KL-49 filter. Thereafter, the irradiated plate was developed with a commercially available developing solution for positive lithographic printing plate (nine-fold dilute solution of DP-4 manufactured by Fuji Photo Film K. K.) and the number of cured steps was measured. The results are shown in Table 2 hereinabove.

Further, the surface of the photosensitive plate was subjected to a cylindrical laser scanning (1000 rpm, 600 lines/inch) while modulating a laser beam, which had been focussed into a beam diameter of 20 μm through an optical system from an air-cooled Argon laser (output of 0.1 W), by an optical modulator. Then, the plate was developed according to the same manner as that described above and the resulting image was evaluated. The results are shown in Table 2.

Further, sensitivity changes of each photopolymerizable composition layer during storing the resulting photosensitive plate at 40° C. for a predetermined period of time was evaluated by the measurement of the number of cured steps. The results are shown in Table 3 and FIG. 1.

TABLE 3

Storage stability of photopolymerizable composition (changes of number of cured steps on storage at 40° C.)

| | Number of steps | | | | | |
|---|---|---|---|---|---|---|
| | Initial | 1 week | 2 weeks | 3 weeks | 4 weeks | 8 weeks | 12 weeks |
| Ex. 4 | 13 | 13 | 13.5 | 13 | 12.5 | 13 | 13 |
| Ex. 5 | 14.5 | 14 | 14.5 | 14.5 | 14 | 14.5 | 14.5 |
| Ex. 6 | 15 | 15 | 14.5 | 25 | 15 | 14.5 | 15 |
| Comp. Ex. 4 | 11 | 8 | 7 | 7 | 6.5 | 6 | 6.5 |
| Comp. Ex. 5 | 13 | 10.5 | 9.5 | 9 | 8.5 | 7.5 | 8 |
| Comp. Ex. 6 | 13 | 10 | 9 | 9.5 | 9 | 8.5 | 9 |

What is claimed is

1. A photopolymerizable composition comprising
(A) an addition-polymerizable compound having an ethylenically unsaturated double bond,
(B) a compound of the formula:

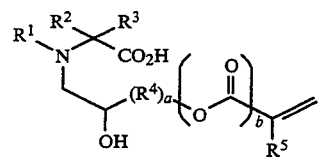

[I]

wherein $R^1$ is a substituted or nonsubstituted phenyl group, $R^2$ and $R^3$ are the same or different and indicate a hydrogen atom or a $C_{1-4}$ alkyl group, $R^4$ is an alkylene group which may have at least one substituent selected from alkyl, hydroxyl and oxo (=O) on a main chain, or which may contain at least one member selected from an oxygen atom and a cycloalkylene group in a main chain, $R^5$ is a hydrogen atom or a methyl group, and a and b are independently 0 or 1,
(C) a light absorbing compound, and
(D) a film-forming polymer having alkaline solubility or alkaline swelling characteristic.

2. The photopolymerizable composition according to claim 1, wherein the light absorbing compound is selected from the group consisting of coumarin dyes, xanthene dyes, thioxanthene dyes, cyanine dyes, merocyanine dyes and titanocene and derivatives thereof.

3. The photopolymerizable composition according to claim 2 which further comprises a diaryl iodonium salt.

4. A photosensitive lithographic printing plate comprising the photopolymerizable composition according to claim 2.

5. The photopolymerizable composition according to claim 1 which further comprises a diaryl iodonium salt.

6. A photosensitive lithographic printing plate comprising the photopolymerizable composition according to claim 5.

7. A photosensitive lithographic printing plate comprising the photopolymerizable composition according to claim 1.

* * * * *